US009805679B2

(12) United States Patent
Dai (10) Patent No.: US 9,805,679 B2
(45) Date of Patent: Oct. 31, 2017

(54) SCAN DRIVING CIRCUIT AND NOR GATE LOGIC OPERATION CIRCUIT THEREOF (71) Applicant: Shenzhen China Star Optoelectronics Technology Co., Ltd., Shenzhen, Guangdong (CN)

(72) Inventor: Chao Dai, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 376 days.

(21) Appl. No.: 14/438,606

(22) PCT Filed: Jan. 28, 2015

(86) PCT No.: PCT/CN2015/071714
§ 371 (c)(1),
(2) Date: Apr. 24, 2015

(87) PCT Pub. No.: WO2016/109995
PCT Pub. Date: Jul. 14, 2016

(65) Prior Publication Data
US 2016/0343337 A1    Nov. 24, 2016

(30) Foreign Application Priority Data

Jan. 9, 2015  (CN) .......................... 2015 1 0012006

(51) Int. Cl.
*G09G 3/20* (2006.01)
*G09G 3/36* (2006.01)
(Continued)

(52) U.S. Cl.
CPC .............. *G09G 3/3677* (2013.01); *G09G 3/20* (2013.01); *H01L 27/1225* (2013.01);
(Continued)

(58) Field of Classification Search
CPC ................... G09G 3/3677; G09G 3/20; G09G 2300/0404; G09G 2310/0267; G09G 2310/0286; G09G 2310/0291; G09G 3/36; G09G 3/2092; G09G 2300/0842; G09G 2300/0871; H01L 27/1225; H01L 27/124; H01L 27/1251; H01L 27/1255;
(Continued)

(56) References Cited

U.S. PATENT DOCUMENTS

| 4,613,940 A * | 9/1986 | Shenton .............. G06F 17/5068 257/E21.602 |
| 2012/0242370 A1 * | 9/2012 | Park ....................... H03K 19/20 326/112 |
| 2017/0141777 A1 * | 5/2017 | Wu ......................... H03K 19/20 |

* cited by examiner

*Primary Examiner* — Lun-Yi Lao
*Assistant Examiner* — Jarurat Suteerawongsa
(74) *Attorney, Agent, or Firm* — Andrew C. Cheng (57) ABSTRACT The disclosure is related to a scan driving circuit for an oxide semiconductor thin film transistor and the NOR gate logic operation circuit thereof. The NOR gate logic operation circuit includes a first invertor and a second invertor applied in the pull down holding circuit of the GOA circuit, and a plurality of transistors. The combination of the NTFT and the invertor displaces the original function of the PMOS element to realize a characteristic similar to an original COMS NOR operation circuit, thereby solving a design problem of the logic operation circuit using a IGZO TFT single element, such that a larger scale digital integrated circuit is further suitably integrated into the liquid crystal display.

13 Claims, 3 Drawing Sheets (51) Int. Cl.
*H01L 27/12* (2006.01)
*H03K 19/0944* (2006.01)
*H03K 19/20* (2006.01)

(52) U.S. Cl.
CPC .......... *H03K 19/0944* (2013.01); *H03K 19/20* (2013.01); *G09G 2300/0404* (2013.01); *G09G 2310/0267* (2013.01); *G09G 2310/0286* (2013.01); *G09G 2310/0291* (2013.01)

(58) Field of Classification Search
CPC .......... H01L 29/7869; H03K 19/0944; H03K 19/20; G11C 19/28
See application file for complete search history.

SCAN DRIVING CIRCUIT AND NOR GATE LOGIC OPERATION CIRCUIT THEREOF

BACKGROUND

Technical Field

The disclosure is related to liquid crystal display technology field, and more particular to a scan driving circuit for an oxide semiconductor thin film transistor and a NOR gate logic operation circuit thereof.

Related Art

For a large scale integrated circuit, three most basic elements in a logic operation circuit are an inverter, a NAND gate, or a NOR gate. Generally, the three elements are manufactured by using CMOS FET, i.e. the circuit includes two elements of PMOS and NMOS.

In an oxide semiconductor element, IGZO has become the focus of attention for the next generation display, and the oxide semiconductor has better NTFT characteristic due to the special material structure. However, the thin film transistor (TFT) also has two elements of PTFT and NTFT, but only in LTPS process, a PTFT element with better performance is obtained. Therefore, how to use a single element (PTFT or NTFT) to manufacture an inverter, a NAND or a NOR has become a serious problem.

SUMMARY

The technique problem mainly solved by the disclosure is to provide a scan driving circuit for an oxide semiconductor thin film transistor and a NOR gate logic operation circuit thereof which is able to manufacture NAND by using a single element (PTFT or NTFT).

In order to solve the above technique problem, the disclosure provides NOR gate logic operation circuit, wherein the NOR gate logic operation circuit comprises a first invertor and a second invertor applied in a pull down holding circuit of a GOA circuit; a thirteenth transistor, a gate of the thirteenth transistor electrically connected to an output terminal of the first invertor, a drain of the thirteenth transistor electrically connected to a high potential of a constant voltage; a fourteenth transistor, a gate of the fourteenth transistor electrically connected to an output terminal of the second invertor, a drain of the fourteenth transistor electrically connected to a source of the thirteenth transistor, a source of the fourteenth transistor electrically connected to an output terminal of the logic operation circuit; a fifteenth transistor, a gate of the fifteenth transistor electrically connected to a first input terminal of the logic operation circuit, a drain of the fifteenth transistor electrically connected to the output terminal of the logic operation circuit, a source of the fifteenth transistor electrically connected to a low potential of the constant voltage; and a sixteenth transistor, a gate of the sixteenth transistor electrically connected to a second input terminal of the logic operation circuit, a drain of the sixteenth transistor electrically connected to the output terminal of the logic operation circuit, a source of sixteenth transistor electrically connected to the low potential of the constant voltage; the first invertor and the second invertor receive a circuit control signal through the low potential of the constant voltage and a first negative potential.

In order to solve the above technique problem, the disclosure further provides a NOR gate logic operation circuit, wherein the NOR gate logic operation circuit comprises a first invertor and a second invertor applied in a pull down holding circuit of a GOA circuit, a thirteenth transistor, a gate of the thirteenth transistor electrically connected to an output terminal of the first invertor, a drain of the thirteenth transistor electrically connected to a high potential of a constant voltage; a fourteenth transistor, a gate of the fourteenth transistor electrically connected to an output terminal of the second invertor, a drain of the fourteenth transistor electrically connected to a source of the thirteenth transistor, a source of the fourteenth transistor electrically connected to an output terminal of the logic operation circuit; a fifteenth transistor, a gate of the fifteenth transistor electrically connected to a first input terminal of the logic operation circuit, a drain of the fifteenth transistor electrically connected to the output terminal of the logic operation circuit, a source of the fifteenth transistor electrically connected to a low potential of the constant voltage; and a sixteenth transistor, a gate of the sixteenth transistor electrically connected to a second input terminal of the logic operation circuit, a drain of the sixteenth transistor electrically connected to the output terminal of the logic operation circuit, a source of sixteenth transistor electrically connected to the low potential of the constant voltage.

In one embodiment, the first invertor and the second invertor are the same, and each of the first invertor and the second invertor includes: a first transistor, a gate and a drain of the first transistor electrically connected to the high potential of the constant voltage, a source of the first transistor electrically connected to a first node; a second transistor, a gate of the second transistor electrically connected to the input terminal of the invertor, a drain of the second transistor electrically connected to the first node, a drain of the second transistor electrically connected to a first negative potential, a third transistor, a gate of the third transistor electrically connected to the first node, a drain of the third transistor electrically connected to the high potential of the constant voltage, a source of the third transistor electrically connected to the output terminal, a fourth transistor, a gate of the fourth transistor electrically connected to the input terminal of the invertor, a drain of the fourth transistor eclectically connected to the output terminal of the invertor, a source of the fourth transistor electrically connected to a second node; a fifth transistor, a gate and a drain of the fifth transistor electrically connected to the high potential of the constant voltage, a source of the fifth transistor electrically connected to a third node; a sixth transistor, a gate of the sixth transistor electrically connected to the input terminal of the invertor, a drain of the sixth transistor electrically connected to the third node, a source of the sixth transistor electrically connected to the low potential of the constant voltage; a seventh transistor, a gate of the seventh transistor electrically connected to the third node, a drain of the seventh transistor electrically connected to the high potential of the constant voltage, a source of the seventh transistor electrically connected to the second node; a eighth transistor, a gate of the eighth transistor electrically connected to the input terminal of the invertor, a drain of the eighth transistor electrically connected to second node, a source of the eighth transistor electrically connected to the low potential of the constant voltage.

In one embodiment, the first invertor and the second invertor receive a circuit control signal through the low potential of the constant voltage and the first negative potential.

In one embodiment, the first invertor and the second invertor are the same, and each of the first invertor and the second invertor includes: a twenty-first transistor, a gate and a drain of the twenty-first transistor electrically connected to the high potential of the constant voltage, a source of the twenty-first transistor electrically connected to a first node;

a twenty-second transistor, a gate of the twenty-second transistor electrically connected to the input terminal of the invertor, a drain of the twenty-second transistor electrically connected to the first node, a drain of the twenty-second transistor electrically connected to a first negative potential; a twenty-third transistor, a gate of the twenty-third transistor electrically connected to the first node, a drain of the twenty-third transistor electrically connected to the high potential of the constant voltage, a source of the twenty-third transistor electrically connected to the output terminal of the invertor; a twenty-fourth transistor, a gate of the twenty-fourth transistor electrically connected to the input terminal of the invertor, a drain of the twenty-fourth transistor eclectically connected to the output terminal of the invertor, a source of the twenty-fourth transistor electrically connected to a second node; a twenty-fifth transistor, a gate of the twenty-fifth transistor electrically connected to a third node, a drain of the twenty-fifth transistor electrically connected to the high potential of the constant voltage, a source of the twenty-fifth transistor electrically connected to the second node; a twenty-sixth transistor, a gate of the twenty-sixth transistor electrically connected to the input terminal of the invertor, a drain of the twenty-sixth transistor electrically connected to the second node, a source of the twenty-sixth transistor electrically connected to the low potential of the constant voltage.

In one embodiment, the first invertor and the second invertor receive a circuit control signal through the high potential of the constant voltage and the low potential of the constant voltage.

In one embodiment the first invertor includes: a first transistor, a gate and a drain of the first transistor electrically connected to the high potential of the constant voltage, a source of the first transistor electrically connected to a first node; a second transistor, a gate of the second transistor electrically connected to the input terminal of the first invertor, a drain of the second transistor electrically connected to the first node, a drain of the second transistor electrically connected to a first negative potential; a third transistor, a gate of the third transistor electrically connected to the first node, a drain of the third transistor electrically connected to the high potential of the constant voltage, a source of the third transistor electrically connected to the output terminal; a fourth transistor, a gate of the fourth transistor electrically connected to the input terminal of the invertor, a drain of the fourth transistor eclectically connected to the output terminal of the first invertor, a source of the fourth transistor electrically connected to a second node; a fifth transistor, a gate and a drain of the fifth transistor electrically connected to the high potential of the constant voltage, a source of the fifth transistor is electrically connected to a third node; a sixth transistor, a gate of the sixth transistor electrically connected to the input terminal of the first invertor, a drain of the sixth transistor electrically connected to the third node, a source of the sixth transistor electrically connected to the low potential of the constant voltage; a seventh transistor, a gate of the seventh transistor electrically connected to the third node, a drain of the seventh transistor electrically connected to the high potential of the constant voltage, a source of the seventh transistor electrically connected to the second node; a eighth transistor, a gate of the eighth transistor electrically connected to the input terminal of the first invertor, a drain of the eighth transistor electrically connected to second node, a source of the eighth transistor electrically connected to the low potential of the constant voltage; the second invertor includes: a twenty-first transistor, a gate and a drain of the twenty-first transistor electrically connected to the high potential of the constant voltage, a source of the twenty-first transistor electrically connected to the first node; a twenty-second transistor, a gate of the twenty-second transistor electrically connected to the input terminal of the second invertor, a drain of the twenty-second transistor electrically connected to the first node, a drain of the twenty-second transistor electrically connected to the first negative potential; a twenty-third transistor, a gate of the twenty-third transistor electrically connected to the first node, a drain of the twenty-third transistor electrically connected to the high potential of the constant voltage, a source of the twenty-third transistor electrically connected to the output terminal of the second invertor, a twenty-fourth transistor, a gate of the twenty-fourth transistor electrically connected to the input terminal of the second invertor, a drain of the twenty-fourth transistor eclectically connected to the output terminal of the second invertor, a source of the twenty-fourth transistor electrically connected to the second node; a twenty-fifth transistor, a gate of the twenty-fifth transistor electrically connected to the third node, a drain of the twenty-fifth transistor electrically connected to the high potential of the constant voltage, a source of the twenty-fifth transistor electrically connected to the second node; a twenty-sixth transistor, a gate of the twenty-sixth transistor electrically connected to the input terminal of the second invertor, a drain of the twenty-sixth transistor electrically connected to the second node, a source of the twenty-sixth transistor electrically connected to the low potential of the constant voltage.

In one embodiment, the first invertor receives a circuit control signal through the low potential of the constant voltage and the first negative potential, and the second invertor receives the circuit control signal through the high potential of the constant voltage and the low potential of the constant voltage.

In one embodiment, a relationship of the first negative potential, a second negative potential and the low potential of the constant voltage is: the low potential of the constant voltage<the second negative potential<the first negative potential.

In one embodiment, the NOR gate logic operation circuit receives a circuit control signal through the high potential of the constant voltage and the low potential of the constant voltage.

In order to solve the above technique problem, the disclosure further provides a scan driving circuit for an oxide semiconductor thin film transistor, wherein the scan driving circuit comprises a NOR gate logic operation circuit, the NOR gate logic operation circuit comprising a first invertor and a second invertor applied in a pull down holding circuit of a GOA circuit, a thirteenth transistor, a gate of the thirteenth transistor electrically connected to an output terminal of the first invertor, a drain of the thirteenth transistor electrically connected to a high potential of a constant voltage; a fourteenth transistor, a gate of the fourteenth transistor electrically connected to an output terminal of the second invertor, a drain of the fourteenth transistor electrically connected to a source of the thirteenth transistor, a source of the fourteenth transistor electrically connected to an output terminal of the logic operation circuit; a fifteenth transistor, a gate of the fifteenth transistor electrically connected to a first input terminal of the logic operation circuit, a drain of the fifteenth transistor electrically connected to the output terminal of the logic operation circuit, a source of the fifteenth transistor electrically connected to a low potential of the constant voltage; a sixteenth transistor, a gate of the sixteenth transistor electrically connected to a second input terminal of the logic operation circuit, a drain of the sixteenth transistor electrically connected to the output terminal of the logic operation circuit, a source of sixteenth transistor electrically connected to the low potential of the constant voltage.

In one embodiment, the first invertor and the second invertor are the same, and each of the first invertor and the second invertor includes: a first transistor, a gate and a drain of the first transistor electrically connected to the high potential of the constant voltage, a source of the first transistor electrically connected to a first node; a second transistor, a gate of the second transistor electrically connected to the input terminal of the invertor, a drain of the second transistor electrically connected to the first node, a drain of the second transistor electrically connected to a first negative potential; a third transistor, a gate of the third transistor is electrically connected to the first node, a drain of the third transistor electrically connected to the high potential of the constant voltage, a source of the third transistor electrically connected to the output terminal; a fourth transistor, a gate of the fourth transistor electrically connected to the input terminal of the invertor, a drain of the fourth transistor eclectically connected to the output terminal of the invertor, a source of the fourth transistor electrically connected to a second node; a fifth transistor, a gate and a drain of the fifth transistor are electrically connected to the high potential of the constant voltage, a source of the fifth transistor electrically connected to a third node; a sixth transistor, a gate of the sixth transistor electrically connected to the input terminal of the invertor, a drain of the sixth transistor electrically connected to the third node, a source of the sixth transistor electrically connected to the low potential of the constant voltage; a seventh transistor, a gate of the seventh transistor electrically connected to the third node, a drain of the seventh transistor electrically connected to the high potential of the constant voltage, a source of the seventh transistor electrically connected to the second node; a eighth transistor, a gate of the eighth transistor electrically connected to the input terminal of the invertor, a drain of the eighth transistor electrically connected to second node, a source of the eighth transistor electrically connected to the low potential of the constant voltage.

In one embodiment, the first invertor and the second invertor receive a circuit control signal through the low potential of the constant voltage and the first negative potential.

In one embodiment, the first invertor and the second invertor are the same, and each of the first invertor and the second invertor includes: a twenty-first transistor, a gate and a drain of the twenty-first transistor electrically connected to the high potential of the constant voltage, a source of the twenty-first transistor electrically connected to a first node; a twenty-second transistor, a gate of the twenty-second transistor electrically connected to the input terminal of the invertor, a drain of the twenty-second transistor electrically connected to the first node, a drain of the twenty-second transistor electrically connected to a first negative potential; a twenty-third transistor, a gate of the twenty-third transistor electrically connected to the first node, a drain of the twenty-third transistor electrically connected to the high potential of the constant voltage, a source of the twenty-third transistor electrically connected to the output terminal of the invertor; a twenty-fourth transistor, a gate of the twenty-fourth transistor electrically connected to the input terminal of the invertor, a drain of the twenty-fourth transistor eclectically connected to the output terminal of the invertor, a source of the twenty-fourth transistor electrically connected to a second node; a twenty-fifth transistor, a gate of the twenty-fifth transistor electrically connected to a third node, a drain of the twenty-fifth transistor electrically connected to the high potential of the constant voltage, a source of the twenty-fifth transistor electrically connected to the second node; a twenty-sixth transistor, a gate of the twenty-sixth transistor electrically connected to the input terminal of the invertor, a drain of the twenty-sixth transistor electrically connected to the second node, a source of the twenty-sixth transistor electrically connected to the low potential of the constant voltage.

In one embodiment, the first invertor and the second invertor receive a circuit control signal through the high potential of the constant voltage and the low potential of the constant voltage.

In one embodiment, the first invertor includes: a first transistor, a gate and a drain of the first transistor electrically connected to the high potential of the constant voltage, a source of the first transistor electrically connected to a first node; a second transistor, a gate of the second transistor electrically connected to the input terminal of the first invertor, a drain of the second transistor electrically connected to the first node, a drain of the second transistor electrically connected to a first negative potential; a third transistor, a gate of the third transistor electrically connected to the first node, a drain of the third transistor electrically connected to the high potential of the constant voltage, a source of the third transistor electrically connected to the output terminal; a fourth transistor, a gate of the fourth transistor electrically connected to the input terminal of the invertor, a drain of the fourth transistor eclectically connected to the output terminal of the first invertor, a source of the fourth transistor electrically connected to a second node; a fifth transistor, a gate and a drain of the fifth transistor electrically connected to the high potential of the constant voltage, a source of the fifth transistor electrically connected to a third node; a sixth transistor, a gate of the sixth transistor electrically connected to the input terminal of the first invertor, a drain of the sixth transistor electrically connected to the third node, a source of the sixth transistor electrically connected to the low potential of the constant voltage; a seventh transistor, a gate of the seventh transistor electrically connected to the third node, a drain of the seventh transistor electrically connected to the high potential of the constant voltage, a source of the seventh transistor electrically connected to the second node; a eighth transistor, a gate of the eighth transistor electrically connected to the input terminal of the first invertor, a drain of the eighth transistor electrically connected to second node, a source of the eighth transistor electrically connected to the low potential of the constant voltage; the second invertor includes: a twenty-first transistor, a gate and a drain of the twenty-first transistor electrically connected to the high potential of the constant voltage, a source of the twenty-first transistor electrically connected to the first node; a twenty-second transistor, a gate of the twenty-second transistor electrically connected to the input terminal of the second invertor, a drain of the twenty-second transistor electrically connected to the first node, a drain of the twenty-second transistor electrically connected to the first negative potential; a twenty-third transistor, a gate of the twenty-third transistor electrically connected to the first node, a drain of the twenty-third transistor electrically connected to the high potential of the constant voltage, a source of the twenty-third transistor electrically connected to the output terminal of the second invertor; a twenty-fourth transistor, a gate of the twenty-fourth transistor electrically connected to the input terminal of the second invertor, a drain of the twenty-fourth transistor eclectically connected to the output terminal of the second invertor, a source of the twenty-fourth transistor electrically connected to the second node; a twenty-fifth transistor, a gate of the twenty-fifth transistor electrically connected to the third node, a drain of the twenty-fifth transistor electrically connected to the high potential of the constant voltage, a source of the twenty-fifth transistor is electrically connected to the second node; a twenty-sixth transistor, a gate of the twenty-sixth transistor electrically connected to the input terminal of the second invertor, a drain of the twenty-sixth transistor electrically connected to the second node, a source of the twenty-sixth transistor electrically connected to the low potential of the constant voltage.

In one embodiment, the first invertor receives a circuit control signal through the low potential of the constant voltage and the first negative potential, and the second invertor receives the circuit control signal through the high potential of the constant voltage and the low potential of the constant voltage.

In one embodiment, a relationship of the first negative potential, a second negative potential and the low potential of the constant voltage is: the low potential of the constant voltage<the second negative potential<the first negative potential.

In one embodiment, the NOR gate logic operation circuit receives a circuit control signal through the high potential of the constant voltage and the low potential of the constant voltage.

The effects of the disclosure different from the current technique is that the scan driving circuit for an oxide semiconductor thin film transistor and the NOR gate logic operation circuit thereof of the disclosure includes the first invertor and the second invertor applied in the pull down holding circuit of the GOA circuit, and a plurality of transistors. A combination of the NTFT and the invertor replaces the original function of an PMOS element to realize a characteristic similar to the original COMS NOR operation circuit, thereby solving a design problem of the logic operation circuit using a IGZO TFT single element, such that a larger scale digital integrated circuit further is suitably integrated into the liquid crystal display.

BRIEF DESCRIPTION OF THE DRAWINGS

The above and other exemplary aspects, features and advantages of certain exemplary embodiments of the present disclosure will be more apparent from the following description taken in conjunction with the accompanying drawings, in which.

DETAILED DESCRIPTION

The following description with reference to the accompanying drawings is provided to clearly and completely explain the exemplary embodiments of the disclosure. It is apparent that the following embodiments are merely some embodiments of the disclosure rather than all embodiments of the disclosure. According to the embodiments in the disclosure, all the other embodiments attainable by those skilled in the art without creative endeavor belong to the protection scope of the disclosure.

Figure 1:
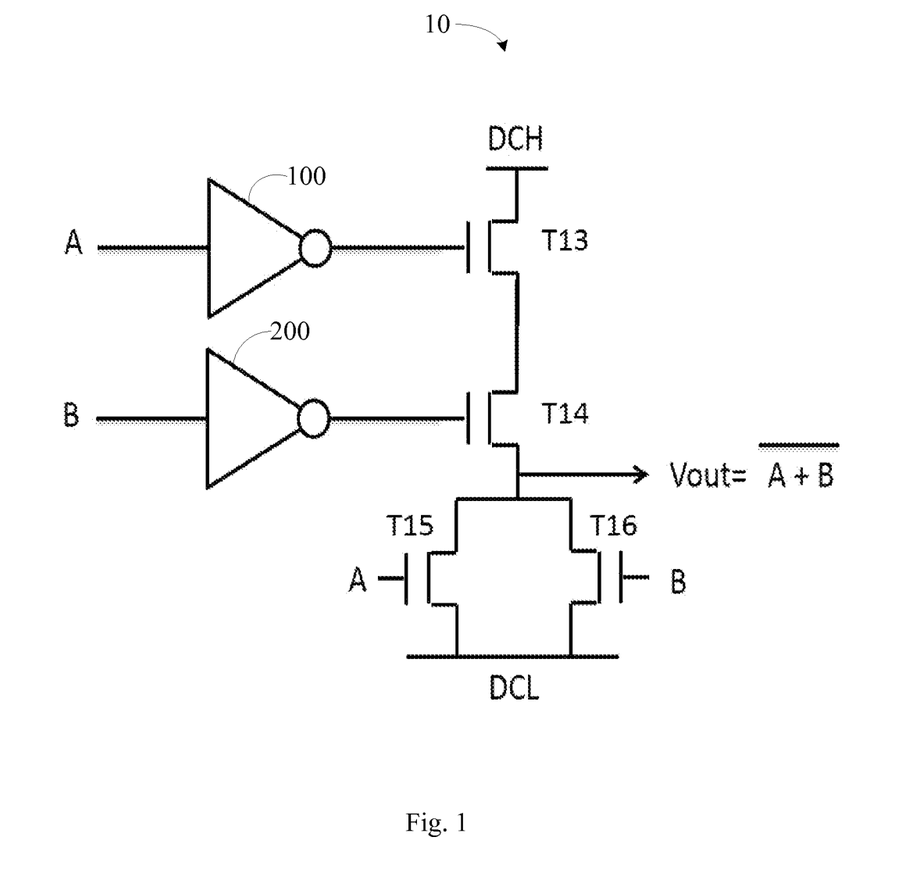
FIG. 1 is a circuit diagram of the NOR gate logic operation circuit according to the embodiment of the disclosure.

Refer to FIG. 1. FIG. 1 is a circuit diagram of the NOR gate logic operation circuit according to the embodiment of the disclosure. The NOR gate logic operation circuit 10 is applied to a logic operation circuit of a scan driving circuit for an oxide semiconductor thin film transistor.

The circuit 10 includes a first invertor 100 and a second invertor 200, wherein both of the first invertor 100 and the second invertor 200 are applied in a pull down holding circuit of a GOA circuit.

Further, both of the first invertor 100 and the second invertor 200 are applied in a mainly invertor portion of the pull down holding circuit of the GOA circuit.

The circuit 10 further includes:

a thirteenth transistor T13, a gate of the thirteenth transistor T13 electrically connected to an output terminal of the first invertor, a drain of the thirteenth transistor T13 electrically connected to a high potential of a constant voltage DCH;

a fourteenth transistor T14, a gate of the fourteenth transistor T14 electrically connected to an output terminal of the second invertor, a drain of the fourteenth transistor T14 electrically connected to a source of the thirteenth transistor T13, a source of the fourteenth transistor electrically connected to an output terminal Vout of the logic operation circuit;

a fifteenth transistor T15, a gate of the fifteenth transistor T15 electrically connected to a first input terminal A of the logic operation circuit, a drain of the fifteenth transistor T15 electrically connected to the output terminal Vout of the logic operation circuit, a source of the fifteenth transistor T15 electrically connected to a low potential of the constant voltage DCL and a sixteenth transistor T16, a gate of the sixteenth transistor T16 electrically connected to a second input terminal B of the logic operation circuit, a drain of the sixteenth transistor T16 electrically connected to the output terminal Vout of the logic operation circuit, a source of sixteenth transistor T16 electrically connected to the low potential of the constant voltage DCL.

In one embodiment, the NOR gate logic operation circuit receives a circuit control signal through the high potential of the constant voltage DCH and the low potential of the constant voltage DCL.

Figure 2:
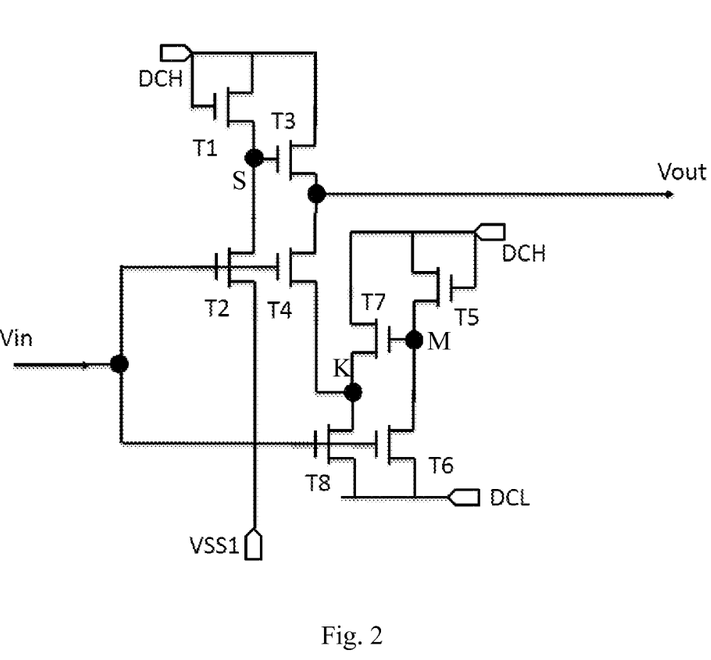
FIG. 2 is a circuit diagram of the first invertor of the NOR gate logic operation circuit according to the embodiment of the disclosure.

Refer to FIG. 2 simultaneously. FIG. 2 is a circuit diagram of the first invertor of the NOR gate logic operation circuit according to the embodiment of the disclosure. The structure and the connection relationship of the invertor are described as following.

For the first transistor T1, a gate and a drain of the first transistor T1 are electrically connected to the high potential of the constant voltage DCH, and a source of the first transistor T1 is electrically connected to a first node S.

For the second transistor T2, a gate of the second transistor T2 is electrically connected to the input terminal Vin of the invertor, a drain of the second transistor T2 is electrically connected to the first node S, and a drain of the second transistor T2 is electrically connected to a first negative potential VSS1.

For the third transistor T3, a gate of the third transistor T3 is electrically connected to the first node S, a drain of the third transistor T3 is electrically connected to the high potential of the constant voltage DCH, and a source of the third transistor T3 is electrically connected to the output terminal Vout.

For the fourth transistor T4, a gate of the fourth transistor T4 is electrically connected to the input terminal Vin of the invertor, a drain of the fourth transistor T4 is eclectically connected to the output terminal Vout of the invertor, and a source of the fourth transistor T4 is electrically connected to a second node K.

For the fifth transistor T5, a gate and a drain of the fifth transistor T5 are electrically connected to the high potential of the constant voltage DCH, and a source of the fifth transistor T5 is electrically connected to a third node M.

For the sixth transistor T6, a gate of the sixth transistor T6 is electrically connected to the input terminal Vin of the invertor, a drain of the sixth transistor T6 is electrically connected to the third node M, and a source of the sixth transistor T6 is electrically connected to the low potential of the constant voltage DCL.

For the seventh transistor T7, a gate of the seventh transistor T7 is electrically connected to the third node M, a drain of the seventh transistor T7 is electrically connected to the high potential of the constant voltage DCH, and a source of the seventh transistor T7 is electrically connected to the second node K.

For the eighth transistor T8, a gate of the eighth transistor T8 is electrically connected to the input terminal Vin of the invertor, a drain of the eighth transistor T8 is electrically connected to second node K, and a source of the eighth transistor T8 is electrically connected to the low potential of the constant voltage DCL.

In one embodiment, the invertor receives a circuit control signal through the low potential of the constant voltage DCL and the first negative potential VSS1.

A relationship of the first negative potential VSS1, a second negative potential VSS2 and the low potential of the constant voltage DCL is: the low potential of the constant voltage DCL<the second negative potential VSS2<the first negative potential VSS1.

Figure 3:
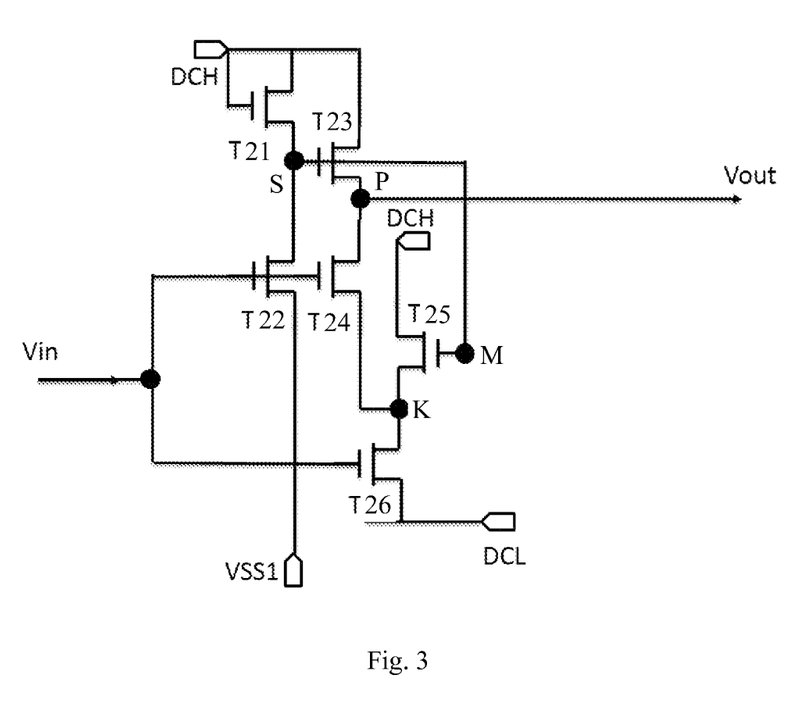
FIG. 3 a circuit diagram of the second invertor of the NOR gate logic operation circuit according to the embodiment of the disclosure.

FIG. 3 is a circuit diagram of the second invertor of the NOR gate logic operation circuit according to the embodiment of the disclosure. The structure and the connection relationship of the invertor are described as following:

For the twenty-first transistor T21, a gate and a drain of the twenty-first transistor T21 are electrically connected to the high potential of the constant voltage DCH, and a source of the twenty-first transistor T21 is electrically connected to the first node S.

For the twenty-second transistor T22, a gate of the twenty-second transistor T22 is electrically connected to the input terminal Vin of the invertor, a drain of the twenty-second transistor T22 is electrically connected to the first node S, and a drain of the twenty-second transistor T22 is electrically connected to the first negative potential VSS1.

For the twenty-third transistor T23, a gate of the twenty-third transistor T23 is electrically connected to the first node S, a drain of the twenty-third transistor T23 is electrically connected to the high potential of the constant voltage DCH, and a source of the twenty-third transistor T23 is electrically connected to the output terminal Vout of the invertor;

For the twenty-fourth transistor T24, a gate of the twenty-fourth transistor T24 is electrically connected to the input terminal Vin of the invertor, a drain of the twenty-fourth transistor T24 is eclectically connected to the output terminal Vout of the invertor, and a source of the twenty-fourth transistor T24 is electrically connected to a second node K.

For the twenty-fifth transistor T25, a gate of the twenty-fifth transistor T25 is electrically connected to the third node M, a drain of the twenty-fifth transistor T25 is electrically connected to the high potential of the constant voltage DCH, and a source of the twenty-fifth transistor T25 is electrically connected to the second node K.

For the twenty-sixth transistor T26, a gate of the twenty-sixth transistor T26 is electrically connected to the input terminal Vin of the invertor, a drain of the twenty-sixth transistor T26 is electrically connected to the second node K, and a source of the twenty-sixth transistor T26 is electrically connected to the low potential of the constant voltage DCL.

In one embodiment, the invertor receives a circuit control signal through the low potential of the constant voltage DCL and the first negative potential VSS1.

A relationship of the first negative potential VSS1, a second negative potential VSS2 and the low potential of the constant voltage DCL is: the low potential of the constant voltage DCL<the second negative potential VSS2<the first negative potential VSS1.

In the embodiment, both of the first invertor and the second invertor included in the circuit 100 are the invertor as shown in FIG. 2.

In another embodiment, both of the first invertor and the second invertor included in the circuit 100 are the invertor as shown in FIG. 3.

In yet another embodiment, the first invertor included in the circuit 100 is the invertor as shown in FIG. 2, and the second invertor included in the circuit 100 is the invertor as shown in FIG. 3.

According to the disclosure, the scan driving circuit for an oxide semiconductor thin film transistor and the NOR gate logic operation circuit thereof includes the first invertor and the second invertor applied in the pull down holding circuit of the GOA circuit, and a plurality of transistors. The combination of the NTFT and the invertor displaces the original function of the PMOS element to realize a characteristic similar to an original COMS NOR operation circuit, thereby solving a design problem of the logic operation circuit using a IGZO TFT single element, such that a larger scale digital integrated circuit is further suitably integrated into the liquid crystal display.

Although the present disclosure is illustrated and described with reference to specific embodiments, those skilled in the art will understand that many variations and modifications are readily attainable without departing from the spirit and scope thereof as defined by the appended claims and their legal equivalents.

What is claimed is:

1. A NOR gate logic operation circuit of a display scan driving circuit for a display device, wherein the NOR gate logic operation circuit comprising:
   a first invertor and a second invertor applied in a pull down holding circuit of a Gate-Driver-On-Array (GOA) circuit;
   a thirteenth transistor, a gate of the thirteenth transistor directly connected to an output terminal of the first invertor, a drain of the thirteenth transistor directly connected to a high potential of a constant voltage;
   a fourteenth transistor, a gate of the fourteenth transistor directly connected to an output terminal of the second invertor, a drain of the fourteenth transistor directly connected to a source of the thirteenth transistor, a source of the fourteenth transistor directly connected to an output terminal of the logic operation circuit;
   a fifteenth transistor, a gate of the fifteenth transistor directly connected to a first input terminal of the logic operation circuit, a drain of the fifteenth transistor directly connected to the output terminal of the logic operation circuit, a source of the fifteenth transistor directly connected to a low potential of the constant voltage; and a sixteenth transistor, a gate of the sixteenth transistor directly connected to a second input terminal of the logic operation circuit, a drain of the sixteenth transistor directly connected to the output terminal of the logic operation circuit, a source of sixteenth transistor directly connected to the low potential of the constant voltage;

wherein the first invertor and the second invertor receive a circuit control signal through the low potential of the constant voltage and a first negative potential; and wherein the first invertor receives a circuit control signal through the low potential of the constant voltage and the first negative potential, and the second invertor receives the circuit control signal through the high potential of the constant voltage and the low potential of the constant voltage.

2. A NOR gate logic operation circuit of a display scan driving circuit for a display device, wherein the NOR gate logic operation circuit comprising:

a first invertor and a second invertor applied in a pull down holding circuit of a Gate-Driver-On-Array (GOA) circuit;

a thirteenth transistor, a gate of the thirteenth transistor directly connected to an output terminal of the first invertor, a drain of the thirteenth transistor directly connected to a high potential of a constant voltage;

a fourteenth transistor, a gate of the fourteenth transistor directly connected to an output terminal of the second invertor, a drain of the fourteenth transistor directly connected to a source of the thirteenth transistor, a source of the fourteenth transistor directly connected to an output terminal of the logic operation circuit;

a fifteenth transistor, a gate of the fifteenth transistor directly connected to a first input terminal of the logic operation circuit, a drain of the fifteenth transistor directly connected to the output terminal of the logic operation circuit, a source of the fifteenth transistor directly connected to a low potential of the constant voltage; and a sixteenth transistor, a gate of the sixteenth transistor directly connected to a second input terminal of the logic operation circuit, a drain of the sixteenth transistor directly connected to the output terminal of the logic operation circuit, a source of sixteenth transistor directly connected to the low potential of the constant voltage;

wherein the first invertor receives a circuit control signal through the low potential of the constant voltage and a first negative potential, and the second invertor receives the circuit control signal through the high potential of the constant voltage and the low potential of the constant voltage.

3. The NOR gate logic operation circuit according to claim 2, wherein the first invertor and the second invertor are the same, and each of the first invertor and the second invertor comprises:

a first transistor, a gate and a drain of the first transistor electrically connected to the high potential of the constant voltage, a source of the first transistor is electrically connected to a first node;

a second transistor, a gate of the second transistor electrically connected to the input terminal of the invertor, a drain of the second transistor electrically connected to the first node, a drain of the second transistor electrically connected to a first negative potential;

a third transistor, a gate of the third transistor electrically connected to the first node, a drain of the third transistor electrically connected to the high potential of the constant voltage, a source of the third transistor electrically connected to the output terminal;

a fourth transistor, a gate of the fourth transistor electrically connected to the input terminal of the invertor, a drain of the fourth transistor eclectically connected to the output terminal of the invertor, a source of the fourth transistor electrically connected to a second node;

a fifth transistor, a gate and a drain of the fifth transistor electrically connected to the high potential of the constant voltage, a source of the fifth transistor electrically connected to a third node;

a sixth transistor, a gate of the sixth transistor electrically connected to the input terminal of the invertor, a drain of the sixth transistor electrically connected to the third node, a source of the sixth transistor electrically connected to the low potential of the constant voltage;

a seventh transistor, a gate of the seventh transistor electrically connected to the third node, a drain of the seventh transistor electrically connected to the high potential of the constant voltage, a source of the seventh transistor electrically connected to the second node; and a eighth transistor, a gate of the eighth transistor electrically connected to the input terminal of the invertor, a drain of the eighth transistor electrically connected to second node, a source of the eighth transistor electrically connected to the low potential of the constant voltage.

4. The NOR gate logic operation circuit according to claim 2, wherein the first invertor and the second invertor are the same, and each of the first invertor and the second invertor comprises:

a twenty-first transistor, a gate and a drain of the twenty-first transistor electrically connected to the high potential of the constant voltage, a source of the twenty-first transistor electrically connected to a first node;

a twenty-second transistor, a gate of the twenty-second transistor electrically connected to the input terminal of the invertor, a drain of the twenty-second transistor electrically connected to the first node, a drain of the twenty-second transistor electrically connected to a first negative potential;

a twenty-third transistor, a gate of the twenty-third transistor electrically connected to the first node, a drain of the twenty-third transistor electrically connected to the high potential of the constant voltage, a source of the twenty-third transistor electrically connected to the output terminal of the invertor;

a twenty-fourth transistor, a gate of the twenty-fourth transistor electrically connected to the input terminal of the invertor, a drain of the twenty-fourth transistor eclectically connected to the output terminal of the invertor, a source of the twenty-fourth transistor electrically connected to a second node;

a twenty-fifth transistor, a gate of the twenty-fifth transistor electrically connected to a third node, a drain of the twenty-fifth transistor electrically connected to the high potential of the constant voltage, a source of the twenty-fifth transistor electrically connected to the second node; and a twenty-sixth transistor, a gate of the twenty-sixth transistor electrically connected to the input terminal of the invertor, a drain of the twenty-sixth transistor electrically connected to the second node, a source of the twenty-sixth transistor electrically connected to the low potential of the constant voltage (DCL).

5. The NOR gate logic operation circuit according to claim 2, wherein the first invertor comprises:
   a first transistor, a gate and a drain of the first transistor electrically connected to the high potential of the constant voltage, a source of the first transistor is electrically connected to a first node;
   a second transistor, a gate of the second transistor electrically connected to the input terminal of the first invertor, a drain of the second transistor electrically connected to the first node, a drain of the second transistor electrically connected to a first negative potential;
   a third transistor, a gate of the third transistor electrically connected to the first node, a drain of the third transistor electrically connected to the high potential of the constant voltage, a source of the third transistor electrically connected to the output terminal;
   a fourth transistor, a gate of the fourth transistor electrically connected to the input terminal of the invertor, a drain of the fourth transistor eclectically connected to the output terminal of the first invertor, a source of the fourth transistor electrically connected to a second node;
   a fifth transistor, a gate and a drain of the fifth transistor electrically connected to the high potential of the constant voltage, a source of the fifth transistor electrically connected to a third node;
   a sixth transistor, a gate of the sixth transistor electrically connected to the input terminal of the first invertor, a drain of the sixth transistor electrically connected to the third node, a source of the sixth transistor electrically connected to the low potential of the constant voltage;
   a seventh transistor, a gate of the seventh transistor electrically connected to the third node, a drain of the seventh transistor electrically connected to the high potential of the constant voltage, a source of the seventh transistor electrically connected to the second node; and
   a eighth transistor, a gate of the eighth transistor is electrically connected to the input terminal of the first invertor, a drain of the eighth transistor is electrically connected to second node, a source of the eighth transistor is electrically connected to the low potential of the constant voltage;
   the second invertor comprises:
   a twenty-first transistor, a gate and a drain of the twenty-first transistor electrically connected to the high potential of the constant voltage, a source of the twenty-first transistor electrically connected to the first node;
   a twenty-second transistor, a gate of the twenty-second transistor electrically connected to the input terminal of the second invertor, a drain of the twenty-second transistor electrically connected to the first node, a drain of the twenty-second transistor electrically connected to the first negative potential;
   a twenty-third transistor, a gate of the twenty-third transistor electrically connected to the first node, a drain of the twenty-third transistor electrically connected to the high potential of the constant voltage, a source of the twenty-third transistor electrically connected to the output terminal of the second invertor;
   a twenty-fourth transistor, a gate of the twenty-fourth transistor electrically connected to the input terminal of the second invertor, a drain of the twenty-fourth transistor eclectically connected to the output terminal of the second invertor, a source of the twenty-fourth transistor electrically connected to the second node;
   a twenty-fifth transistor, a gate of the twenty-fifth transistor electrically connected to the third node, a drain of the twenty-fifth transistor electrically connected to the high potential of the constant voltage, a source of the twenty-fifth transistor electrically connected to the second node; and
   a twenty-sixth transistor, a gate of the twenty-sixth transistor electrically connected to the input terminal of the second invertor, a drain of the twenty-sixth transistor electrically connected to the second node, a source of the twenty-sixth transistor electrically connected to the low potential of the constant voltage.

6. The NOR gate logic operation circuit according to claim 5, wherein a relationship of the first negative potential, a second negative potential and the low potential of the constant voltage is: the low potential of the constant voltage<the second negative potential<the first negative potential.

7. The NOR gate logic operation circuit according to claim 5, wherein the NOR gate logic operation circuit receives a circuit control signal through the high potential of the constant voltage and the low potential of the constant voltage.

8. A display scan driving circuit for an oxide semiconductor thin film transistor of a display device, wherein the display scan driving circuit comprises a NOR gate logic operation circuit for the display device, the NOR gate logic operation circuit comprising:
   a first invertor and a second invertor applied in a pull down holding circuit of a Gate-Driver-On-Array (GOA) circuit;
   a thirteenth transistor, a gate of the thirteenth transistor directly connected to an output terminal of the first invertor, a drain of the thirteenth transistor directly connected to a high potential of a constant voltage;
   a fourteenth transistor, a gate of the fourteenth transistor directly connected to an output terminal of the second invertor, a drain of the fourteenth transistor directly connected to a source of the thirteenth transistor, a source of the fourteenth transistor directly connected to an output terminal (Vout) of the logic operation circuit;
   a fifteenth transistor, a gate of the fifteenth transistor is directly connected to a first input terminal of the logic operation circuit, a drain of the fifteenth transistor directly connected to the output terminal of the logic operation circuit, a source of the fifteenth transistor directly connected to a low potential of the constant voltage; and
   a sixteenth transistor, a gate of the sixteenth transistor directly connected to a second input terminal of the logic operation circuit, a drain of the sixteenth transistor directly connected to the output terminal of the logic operation circuit, a source of sixteenth transistor directly connected to the low potential of the constant voltage;
   wherein the first invertor receives a circuit control signal through the low potential of the constant voltage and a first negative potential, and the second invertor receives the circuit control signal through the high potential of the constant voltage and the low potential of the constant voltage.

9. The display scan driving circuit for the oxide semiconductor thin film transistor of a display device according to claim 8, wherein the first invertor and the second invertor are the same, and each of the first invertor and the second invertor comprises:
  a first transistor, a gate and a drain of the first transistor electrically connected to the high potential of the constant voltage, a source of the first transistor electrically connected to a first node;
  a second transistor, a gate of the second transistor electrically connected to the input terminal of the invertor, a drain of the second transistor electrically connected to the first node, a drain of the second transistor electrically connected to a first negative potential;
  a third transistor, a gate of the third transistor electrically connected to the first node, a drain of the third transistor electrically connected to the high potential of the constant voltage, a source of the third transistor electrically connected to the output terminal;
  a fourth transistor, a gate of the fourth transistor electrically connected to the input terminal of the invertor, a drain of the fourth transistor eclectically connected to the output terminal of the invertor, a source of the fourth transistor electrically connected to a second node;
  a fifth transistor, a gate and a drain of the fifth transistor electrically connected to the high potential of the constant voltage, a source of the fifth transistor electrically connected to a third node;
  a sixth transistor, a gate of the sixth transistor electrically connected to the input terminal of the invertor, a drain of the sixth transistor electrically connected to the third node, a source of the sixth transistor electrically connected to the low potential of the constant voltage;
  a seventh transistor, a gate of the seventh transistor electrically connected to the third node, a drain of the seventh transistor electrically connected to the high potential of the constant voltage, a source of the seventh transistor is electrically connected to the second node; and
  an eighth transistor, a gate of the eighth transistor electrically connected to the input terminal of the invertor, a drain of the eighth transistor electrically connected to second node, a source of the eighth transistor electrically connected to the low potential of the constant voltage.

10. The display scan driving circuit for the oxide semiconductor thin film transistor of a display device according to claim 8, wherein the first invertor and the second invertor are the same, and each of the first invertor and the second invertor comprises:
  a twenty-first transistor, a gate and a drain of the twenty-first transistor electrically connected to the high potential of the constant voltage, a source of the twenty-first transistor electrically connected to a first node;
  a twenty-second transistor, a gate of the twenty-second transistor electrically connected to the input terminal of the invertor, a drain of the twenty-second transistor electrically connected to the first node, a drain of the twenty-second transistor electrically connected to a first negative potential;
  a twenty-third transistor, a gate of the twenty-third transistor electrically connected to the first node, a drain of the twenty-third transistor electrically connected to the high potential of the constant voltage, a source of the twenty-third transistor electrically connected to the output terminal of the invertor;
  a twenty-fourth transistor, a gate of the twenty-fourth transistor electrically connected to the input terminal of the invertor, a drain of the twenty-fourth transistor eclectically connected to the output terminal of the invertor, a source of the twenty-fourth transistor is electrically connected to a second node;
  a twenty-fifth transistor, a gate of the twenty-fifth transistor electrically connected to a third node, a drain of the twenty-fifth transistor electrically connected to the high potential of the constant voltage, a source of the twenty-fifth transistor electrically connected to the second node; and
  a twenty-sixth transistor, a gate of the twenty-sixth transistor electrically connected to the input terminal of the invertor, a drain of the twenty-sixth transistor electrically connected to the second node, a source of the twenty-sixth transistor electrically connected to the low potential of the constant voltage.

11. The display scan driving circuit for the oxide semiconductor thin film transistor of a display device according to claim 8, wherein the first invertor comprises:
  a first transistor, a gate and a drain of the first transistor electrically connected to the high potential of the constant voltage, a source of the first transistor electrically connected to a first node;
  a second transistor, a gate of the second transistor electrically connected to the input terminal of the first invertor, a drain of the second transistor electrically connected to the first node, a drain of the second transistor electrically connected to a first negative potential;
  a third transistor, a gate of the third transistor electrically connected to the first node, a drain of the third transistor electrically connected to the high potential of the constant voltage, a source of the third transistor electrically connected to the output terminal;
  a fourth transistor, a gate of the fourth transistor electrically connected to the input terminal of the invertor, a drain of the fourth transistor eclectically connected to the output terminal of the first invertor, a source of the fourth transistor electrically connected to a second node;
  a fifth transistor, a gate and a drain of the fifth transistor electrically connected to the high potential of the constant voltage, a source of the fifth transistor electrically connected to a third node;
  a sixth transistor, a gate of the sixth transistor electrically connected to the input terminal of the first invertor, a drain of the sixth transistor electrically connected to the third node, a source of the sixth transistor electrically connected to the low potential of the constant voltage;
  a seventh transistor, a gate of the seventh transistor electrically connected to the third node, a drain of the seventh transistor electrically connected to the high potential of the constant voltage, a source of the seventh transistor electrically connected to the second node; and
  an eighth transistor, a gate of the eighth transistor electrically connected to the input terminal of the first invertor, a drain of the eighth transistor electrically connected to second node, a source of the eighth transistor electrically connected to the low potential of the constant voltage;
  the second invertor comprises:
  a twenty-first transistor, a gate and a drain of the twenty-first transistor electrically connected to the high potential of the constant voltage, a source of the twenty-first transistor electrically connected to the first node;

a twenty-second transistor, a gate of the twenty-second transistor electrically connected to the input terminal of the second invertor, a drain of the twenty-second transistor electrically connected to the first node, a drain of the twenty-second transistor electrically connected to the first negative potential;

a twenty-third transistor, a gate of the twenty-third transistor electrically connected to the first node, a drain of the twenty-third transistor electrically connected to the high potential of the constant voltage, a source of the twenty-third transistor electrically connected to the output terminal of the second invertor;

a twenty-fourth transistor, a gate of the twenty-fourth transistor electrically connected to the input terminal of the second invertor, a drain of the twenty-fourth transistor eclectically connected to the output terminal of the second invertor, a source of the twenty-fourth transistor electrically connected to the second node;

a twenty-fifth transistor, a gate of the twenty-fifth transistor electrically connected to the third node, a drain of the twenty-fifth transistor electrically connected to the high potential of the constant voltage, a source of the twenty-fifth transistor electrically connected to the second node; and a twenty-sixth transistor, a gate of the twenty-sixth transistor electrically connected to the input terminal of the second invertor, a drain of the twenty-sixth transistor electrically connected to the second node, a source of the twenty-sixth transistor electrically connected to the low potential of the constant voltage.

12. The display scan driving circuit for the oxide semiconductor thin film transistor of a display device according to claim 11, wherein a relationship of the first negative potential, a second negative potential and the low potential of the constant voltages: the low potential of the constant voltage<the second negative potential<the first negative potential.

13. The display scan driving circuit for the oxide semiconductor thin film transistor of a display device according to claim 8, wherein the NOR gate logic operation circuit receives a circuit control signal through the high potential of the constant voltage and the low potential of the constant voltage.

* * * * *